United States Patent [19]

Yoshino

[11] Patent Number: 5,561,076
[45] Date of Patent: Oct. 1, 1996

[54] METHOD OF FABRICATING AN ISOLATION REGION FOR A SEMICONDUCTOR DEVICE USING LIQUID PHASE DEPOSITION

[75] Inventor: Akira Yoshino, Tokyo, Japan

[73] Assignee: NEC Corporation, Tokyo, Japan

[21] Appl. No.: 378,104

[22] Filed: Jan. 26, 1995

Related U.S. Application Data

[63] Continuation of Ser. No. 42,391, Apr. 2, 1993, abandoned.

[30] Foreign Application Priority Data

Apr. 2, 1992 [JP] Japan ..................... 4-080163

[51] Int. Cl.$^6$ ..................... H01L 21/76
[52] U.S. Cl. ..................... 437/62; 437/238
[58] Field of Search ............ 437/62, 238; 148/DIG. 85, 148/DIG. 86

[56] References Cited

U.S. PATENT DOCUMENTS

| | | | |
|---|---|---|---|
| 4,468,420 | 8/1984 | Kawahara et al. | 427/397.7 |
| 4,596,071 | 6/1986 | Kita | 29/576 |
| 4,851,078 | 7/1989 | Short et al. | 156/632 |
| 4,916,086 | 4/1990 | Takahashi . | |
| 4,927,781 | 5/1990 | Miller . | |
| 5,024,965 | 6/1991 | Chang et al. | 437/57 |
| 5,036,021 | 7/1991 | Goto | 437/62 |
| 5,196,373 | 3/1993 | Beasom . | |
| 5,453,395 | 9/1995 | Lar . | |
| 5,472,902 | 12/1995 | Lar . | |

FOREIGN PATENT DOCUMENTS

| | | |
|---|---|---|
| 58-64045 | 4/1983 | Japan . |
| 1-181439 | 7/1989 | Japan . |
| 376249 | 4/1991 | Japan . |
| 3-270254 | 12/1991 | Japan . |
| 4106954 | 4/1992 | Japan . |
| 4-103146 | 4/1992 | Japan . |
| 4245662 | 9/1992 | Japan . |
| 661343 | 3/1994 | Japan . |

OTHER PUBLICATIONS

Vasudev, P. K., et al., "A High Performance Submicrometer CMOS/SOI Technology Using Ultrathin Silicon Films on SIMOX," 1988 Symposium on VLSI Technology Digest of Technical Papers, May 10–13, 1988, pp. 61–62.
Homma, T, et al, "A Selective $SiO_2$ Film–Formation . . . Multilevel Interconnections", J. Electrochem. Soc., vol. 140, No. 8, Aug. 1993.
Omura, Y., et al., "A 4kb CMOS/SIMOX SRAM," 1985 Symposium on VLSI Technology Digest of Technical Papers, May 14–16, 1985, pp. 24–25.
Vogt, H., et al., "MESFETs in Thin Silicon on SIMOX," Electronics Letters, vol. 25, No. 23, Nov. 9, 1989, pp. 1580–1581.

*Primary Examiner*—George Fourson
*Attorney, Agent, or Firm*—Popham Haik Schnobrich & Kaufman, Ltd.

[57] ABSTRACT

The invention provides a method of fabricating a semiconductor device on an SOI substrate having a single crystal silicon substrate, a silicon dioxide film laid on top of the silicon substrate and a single crystal silicon layer laid on top of the silicon dioxide film. The method includes the steps of forming a single crystal silicon island composed of the single crystal silicon layer in a first region in which the semiconductor device is to be fabricated, and selectively forming a low temperature deposition silicon dioxide film in a second region in which the semiconductor device is not to be fabricated in the presence of photoresist, so that the low temperature deposition silicon dioxide film covers side surfaces of the silicon island. The second region turns into an isolation region for electrically separating adjacent semiconductor devices.

8 Claims, 3 Drawing Sheets

5,561,076

METHOD OF FABRICATING AN ISOLATION REGION FOR A SEMICONDUCTOR DEVICE USING LIQUID PHASE DEPOSITION

This is a continuation of U.S. patent application Ser. No. 08/042,391, filed Apr. 2, 1993, now abandoned.

BACKGROUND OF THE INVENTION

1. Field of the Invention

The present invention relates to a method of fabricating semiconductor devices, and in particular to a method of forming an isolation region for providing space among adjacent transistors in semiconductor devices including SOI (silicon on insulator) wafers.

2. Related Art Statement

As integration in very large scale integrated circuits (VLSI) increases, an isolation region provided among adjacent transistors to electrically separate the adjacent transistors has been shrunk enormously. For instance, the size of isolation region in 4M bit DRAM is presently 0.8 micrometers. Thus, it is required to narrow the isolation region's dimension into a range of submicrons' order. Much research and development has been accomplished with respect to a method of forming isolation region for so-called "submicron devices".

One of them is a method using SOI (silicon on insulator) wafers. Various kinds of SOI wafers can be obtained. A typical SOI wafer has a single crystal silicon substrate, a silicon dioxide film laid on top of upper surface of the silicon substrate and having thickness ranging from about 0.5 to 1.0 micrometers, and a single crystal silicon layer laid on top of upper surface of the silicon dioxide film and having thickness ranging from about 0.03 to 0.5 micrometers. Such SOI wafers can be fabricated in various processes, and presently a great deal of has been accomplished.

One of typical reports of such researches is P. K. Vasudev et al., Technical Digest of VLSI Symposium 1988, page 61. FIGS. 1A and 1B are cross-sectional views of a MOS transistor fabricated on the SOI wafer as reported in the Digest, wherein FIG. 1B is a cross-sectional view taken along A—A line in FIG. 1A. Now referring to these FIGS. 1A and 1B, the MOS transistors are formed in single crystal silicon islands 103aa, 103ab disposed on upper surface of a silicon dioxide film 102 which is formed on top of a single crystal silicon substrate 101. Gate oxide films 107 cover the surfaces of the silicon islands 103aa, 103ab including their upper surfaces and side surfaces. On the gate oxide films 107 are disposed gate electrodes 109. In the silicon islands 103aa, 103ab are provided layers 108 with high impurity concentration which work as source/drain. Around the silicon islands 103aa, 103ab the silicon dioxide film 102 is exposed outside. This exposure area corresponds to an isolation region 105. A dimension of the isolation region 105 is defined as space between the silicon islands 103aa and 103ab, and depends on processing accuracy of the silicon islands 103aa, 103ab. The smaller the dimension is, the greater the increase in the level of device integration.

FIGS. 2A to 2E illustrate the steps of fabricating the MOS transistor shown in FIGS. 1A and 1B. An SOI wafer is used as a wafer. As illustrated in FIG. 2A, the SOI wafer has a single crystal silicon substrate 101, a silicon dioxide film 102 laid on top of the silicon substrate 101, and a single crystal silicon layer 103 laid on top of the silicon dioxide film 102. As illustrated in FIG. 2B, thermal oxide film 110 having a thickness of about 30 nanometers is formed over the upper surface of the single crystal silicon layer 103, and then patterned photoresist 104 is formed on top of the thermal oxide film 110. Then, the film 110 is removed by means of reactive ion etching using the photoresist 104 as a mask. Subsequently, the silicon layer 103 is entirely removed using the photoresist 104 as a mask to expose the silicon dioxide film 102, thereby a single crystal silicon island 103a and an isolation region 105 being formed as illustrated in FIG. 2C. After the removal of the photoresist 104, diluted hydrofluoric acid (HF) is used to remove the film 110 located on the upper surface of the silicon island 103a. While removing the film 110, the silicon dioxide film 102 exposed to the isolation region 105 is also etched together with the film 110. In particular, etching effect penetrates a part of silicon dioxide film 102 located beneath the periphery of the silicon island 103a. Thus, the film 102 is undercut in such a manner as illustrated in FIG. 2D. Then, as illustrated in FIG. 2E, the exposed surfaces of the silicon island 103a including its upper, side and lower surfaces are covered with the gate oxide film 107. Finally, the MOS transistor as shown in FIGS. 1A and 1B (wherein an undercut portion of the film 102 is not shown for simplicity) is fabricated using any conventional methods of fabricating MOS transistor.

According to the aforementioned method of fabricating semiconductor devices, the single crystal silicon island disposed on the silicon dioxide film has substantially right angle corners at its upper ends and lower ends. Accordingly, when the MOS transistor works, intensive concentration of electric field happens at a part of the gate oxide film applied adjacent the right angle corners of the silicon island (see FIG. 1B). Such intensive concentration of electric field causes a problem in deteriorating the reliability of the gate oxide film at the right angle corners of the silicon island. The smaller a transistor becomes and thus the thinner the gate oxide film becomes, this problem gets worse. In addition, due to the fact that the silicon island has steps and ends of these steps are so steep, the difficulty arises in step coverage of electrical wiring and insulation films among layers and so on.

Another typical method of forming an isolation region, which is used in forming semiconductor devices on an SOI wafer, is the method of using a LOCOS type field oxide film which was reported in Y. Omura et al., Digest of Technical Papers of 1985 Symposium on VLSI Technology, IEEE CAT. No. 85 CH2125-3, May 14–16, 1985/KOBE, page 24, or Electronics Letters, 9th November 1989, Vol. 25, No. 23, page 1580. In this method, a field oxide film is formed on a single crystal silicon layer of an SOI wafer by means of LOCOS process, and a single crystal silicon island is formed simultaneously with the formation of the field oxide film. Consequently, the single crystal silicon island is exposed outside only at its upper surface. Then, after a gate oxide film is formed on the upper surface of the silicon island, a MOS transistor is fabricated in conventional manners.

Though this method can solve the aforementioned problems, it brings another problems. First, this method causes a so-called bird's beak which makes the contact area narrower for connecting a diffusion layer (source/drain) to electrical wires, resulting in an increase of contact resistance. Secondarily, when the single crystal silicon island is a P-type one (an N-channel MOS transistor is fabricated in this case), the P-type impurity density near boundary area between the field oxide film and the single crystal silicon island decreases more enormously than in the LOCOS process for the conventional single crystal silicon substrate, because of the existence of the buried oxide layer which also absorbs Boron atoms during the LOCOS oxidation process. The decrease in impurity density causes a problem in increasing the leakage current between a source and a drain resulting in a decrease in the threshold voltage of the transistor.

SUMMARY OF THE INVENTION

It is an object of the present invention to solve the aforementioned problems, more particularly to solve the problems of the concentration of an electric field in the gate oxide film which is caused by the corner shapes of the Si island, difficulties in step coverage of electrical wires and insulation films among layers, and in the narrow channel effect, an increase in leakage current between a source and a drain, and an increase in contact resistance.

The invention provides a method of fabricating a semiconductor device on an SOI wafer having a substrate, an insulation layer laid on top of the substrate and a silicon layer laid on top of the insulation layer, comprising steps of forming a silicon island composed of the silicon layer in a first region in which the semiconductor device is to be fabricated, and selectively burying an insulative material in a second region other than the first region so that the insulative material covers side surfaces of the silicon island, the second region turning into an isolation region for electrically separating the semiconductor devices.

In a preferred embodiment, a silicon dioxide film as the insulative material is formed in the second region to form the isolation region by means of an LPD (Liquid Phase Deposition) process using at least aqueous hydrosilicofluoric acid ($H_2SiF_6$) and boric acid ($H_3BO_3$).

In another preferred embodiment, a step of forming a gate oxide film on an upper surface of the silicon island follows the step of forming the isolation region, when the semiconductor device includes at least a transistor.

In still another preferred embodiment, the step of forming the silicon island composed of the silicon layer in the first region includes a step of removing the silicon layer located in the second region.

The above and other objects and advantageous features of the present invention will be made apparent from the following description made with reference to the accompanying drawings.

DESCRIPTION OF THE PREFERRED EMBODIMENTS

A preferred embodiment in accordance with the present invention will be explained hereinbelow with reference to the drawings.

FIGS. 3A to 3E illustrate the steps for fabricating a semiconductor device on an SOI wafer in accordance with the embodiment of the invention.

Figure 1A:
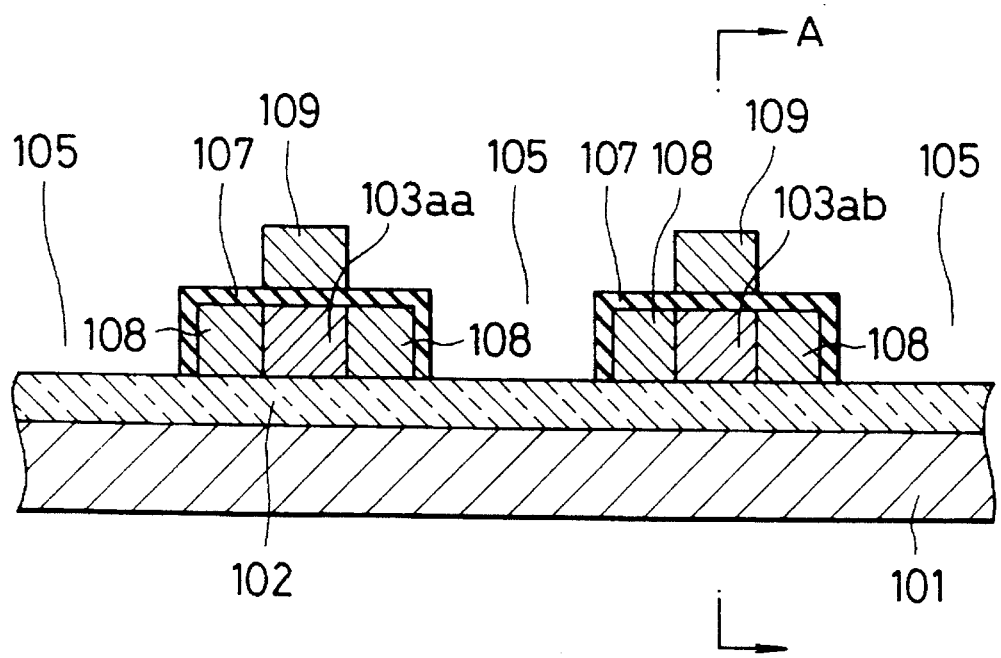
FIGS. 1A and 1B are partially and schematically cross-sectional views illustrating a MOS transistor formed on a conventional SOI wafer.
Figure 1B:
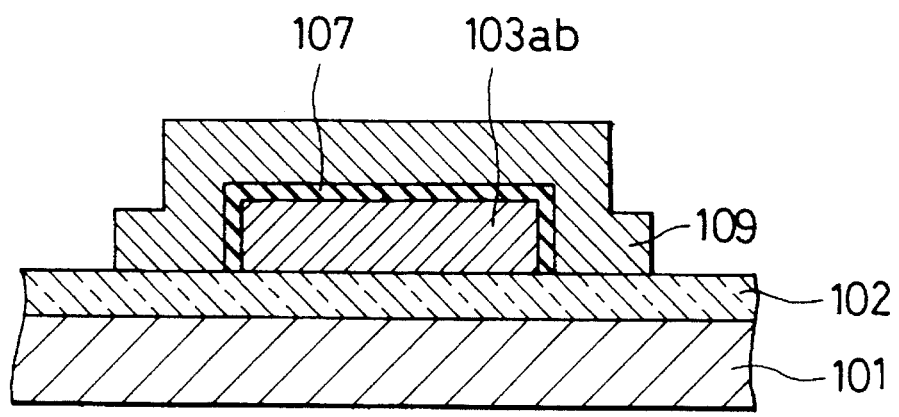
Figure 2A:
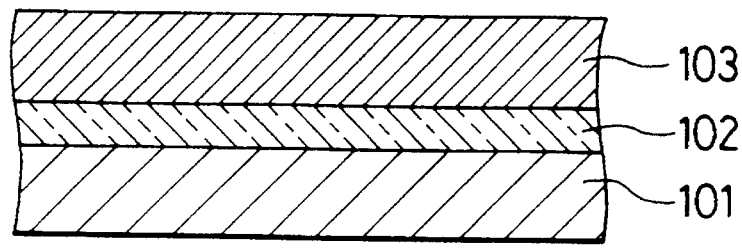
FIGS. 2A to 2E are series of partially and schematically cross-sectional views illustrating the steps of a conventional method of fabricating a MOS transistor on an SOI wafer.
Figure 2B:
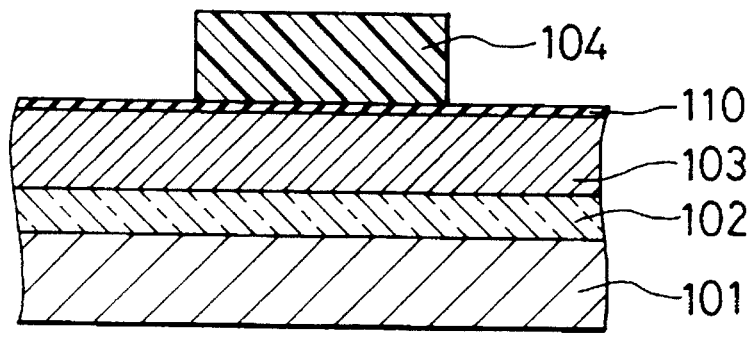
Figure 2C:
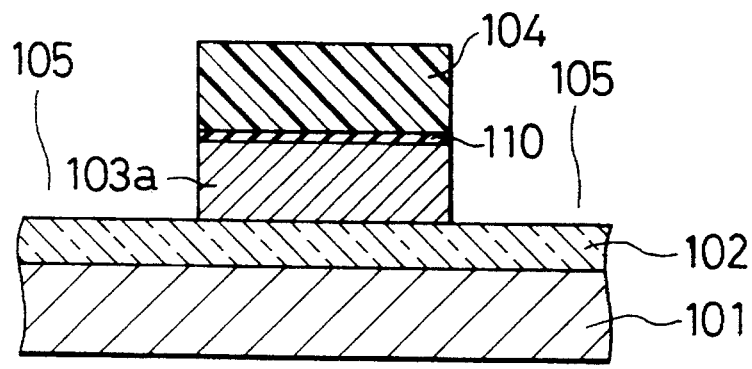
Figure 2D:
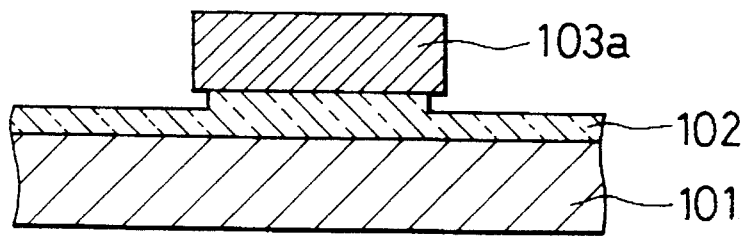
Figure 2E:
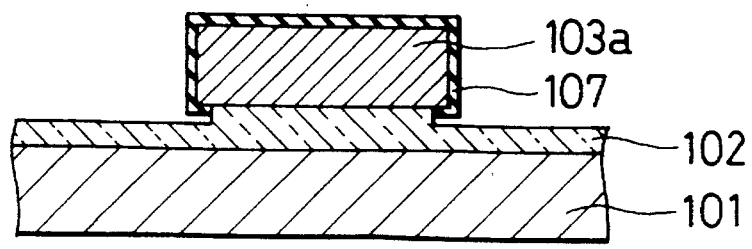
Figure 3A:
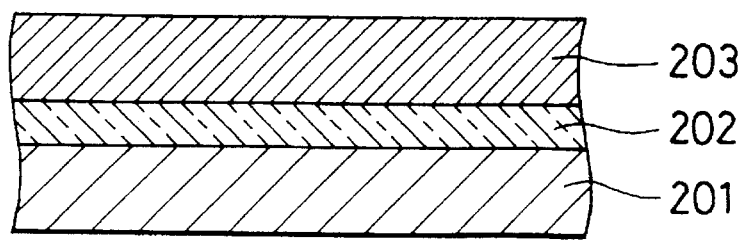
FIGS. 3A to 3E are series of partially and schematically cross-sectional views illustrating the steps of a method of fabricating a MOS transistor on an SOI wafer according to the invention.

Referring now to FIG. 3A, a P-type single crystal silicon substrate 201 is first kept at about 600 degrees centigrade and is ion implanted with oxygen with a dose of $2.0\times10^{18}$ $cm^{-2}$ at 200 keV of accelerating energy. Then, the silicon substrate 201 is subjected to thermal treatment at 1300 degrees centigrade for six hours in an atmosphere consisting of 99.5% argon (Ar) and 0.5% oxygen ($O_2$) to thereby form a P-type single crystal silicon layer 203 having a thickness of about 0.2 micrometers and a silicon dioxide film 202 having a thickness of 0.5 micrometers in the silicon substrate 201. As illustrated in FIG. 3A, the silicon dioxide film 202 is interposed between the silicon layer 203 and the silicon substrate 201.

Figure 3B:
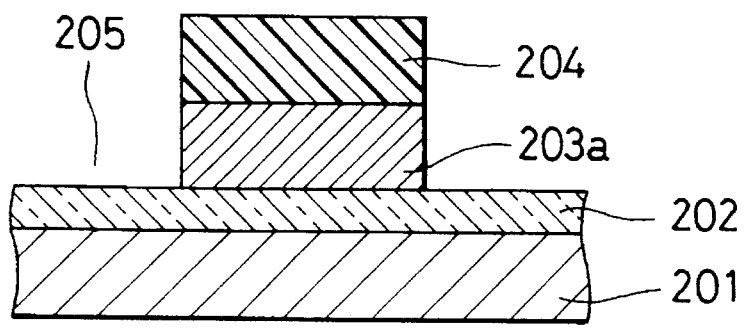

After photoresist 204 is directly applied to the upper surface of the silicon layer 203, the photoresist 204 is patterned by means of conventional photolithography technology to thereby leave the photoresist 204 only in a first region wherein a semiconductor device is to be fabricated and remove the photoresist 204 located in a second region 205 which would be an isolation region. Then, reactive ion etching process in which the photoresist 204 works as a mask is used to entirely remove the silicon layer 203 located in the second region 205 and thus to expose the silicon dioxide film 202 outside, to thereby form a P-type single crystal silicon island 203a composed of the single crystal silicon layer only in the first region (FIG. 3B).

Figure 3C:
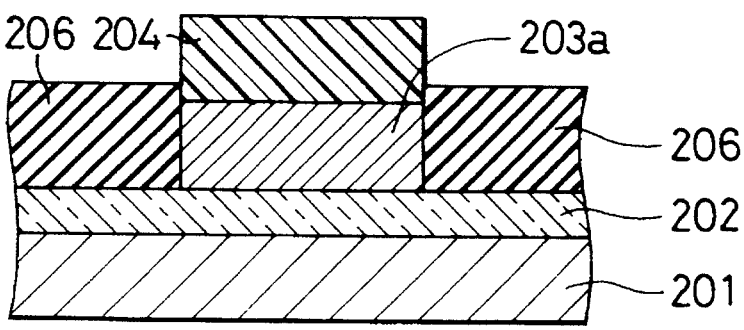

Then, as illustrated in FIG. 3C, a low temperature deposition silicon dioxide film 206 having thickness of, for instance, 0.25 micrometers is formed selectively in the second region 205 by means of a low temperature LPD (Liquid Phase Deposition) process. Desirably, the film 206 is thicker than the silicon island 203a by about 20 to 30 nanometers.

In brief, the film 206 is formed by the LPD process as follows. Impalpably powdered silicon dioxide ($SiO_2$) is dissolved and saturated into aqueous hydrosilicofluoric acid ($H_2SiF_6$) at a temperature ranging from 20 to 100 degrees centigrade. The hydrosilicofluoric acid reacts according to the following reaction formula:

$$H_2SiF_6 + 2H_2O \rightleftharpoons 6HF + SiO_2 \quad (1)$$

Subsequently, aqueous boric acid ($H_3BO_3$) is added to the above reaction system with the result of the silicon dioxide being supersaturated as seen from the following reaction formula:

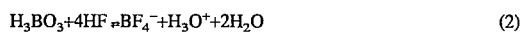

$$H_3BO_3 + 4HF \rightleftharpoons BF_4^- + H_3O^+ + 2H_2O \quad (2)$$

This shows that hydrogen fluoride (HF) is consumed by adding aqueous boric acid to the reaction system represented by the formula (1), resulting in that reaction in the formula (1) is shifted to the right side to separate out silicon dioxide.

The SOI wafer as illustrated in FIG. 3B is dipped into the aforementioned liquid solution to thereby selectively deposit low temperature deposition silicon dioxide film 206 in the second region 205, as illustrated in FIG. 3C. In this step, the film 206 is not deposited at all on the surface of the photoresist 204 while the film 206 is selectively deposited only on the surface of the silicon dioxide film 202 exposed to the second region 205, due to differences in the interfacial reaction caused by differences in the surface condition of the materials. This process reliably controls the deposition rate of the film.

Figure 3D:
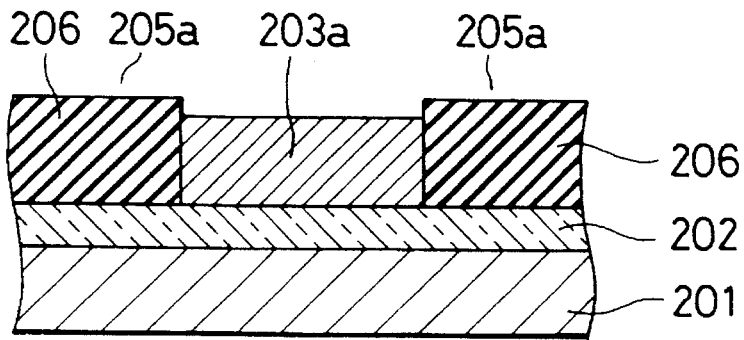
Figure 3E:
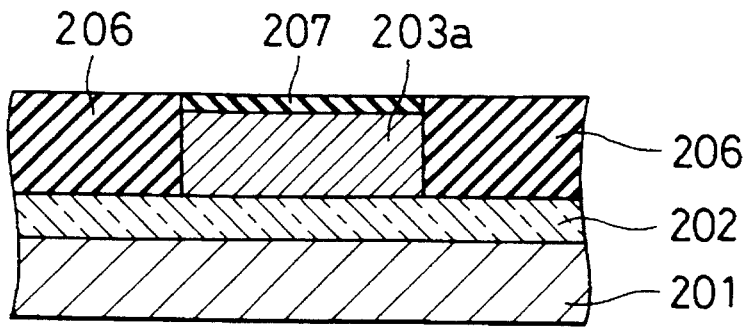

Then, as illustrated in FIG. 3D, the photoresist 204 is removed to thereby form isolation region 205a having the film 206 in the second region 205. Subsequently, as illustrated in FIG. 3E, gate oxide film 207 is formed only on the upper surface of the silicon island 203a which was exposed outside. After this step, a MOS transistor is fabricated in accordance with conventional methods.

As described above with reference to the preferred embodiment, the present invention has many advantages as follows. The film 206 to constitute the isolation region 205a can be formed in low temperature. In addition, the gate oxide film 207 is formed only on the upper surface of the silicon island 203a, and it is easy to align the upper surfaces of the gate oxide film 207 and the film 206. These advantages can prevent the aforementioned problems in the prior art from occurring. That is, the concentration of electric field in the gate insulation film near ends of a single crystal silicon island does not happen, difficulties in step coverage of electrical wires and insulation films among layers do not happen, and problems of the narrow channel effect, a contact resistance increase, and leakage between a source and a drain, all of them found in LOCOS process can be solved.

In the embodiment described above, one example is given for a P-type single crystal silicon island (an N-channel MOS transistor is fabricated in this case), however by reversing the impurity type, it is possible, using the same method, to form an N-type single crystal silicon island (a P-channel MOS transistor is fabricated in this case).

In place of the SOI wafer used in the above-mentioned embodiment, there may be used an SOI wafer with an uppermost single crystal silicon layer patterned with the silicon island before starting the device fabrication.

In place of the single crystal silicon substrate used in the above-mentioned embodiment, there may be used a quartz substrate, a glass substrate or the like for use in devices for display. Furthermore, a polycrystalline silicon layer may be used instead of the above-mentioned single crystal silicon layer (FET is fabricated in the case of the polycrystalline silicon layer).

In this invention, bipolar transistors may be fabricated in accordance with the conventional method.

While the present invention has been described in connection with certain preferred embodiment, it is to be understood that the subject matter encompassed by way of the present invention is not to be limited to the specific embodiment. On the contrary, it is intended for the subject matter of the invention to include all alternatives, modifications and equivalents as can be included within the spirit and scope of the following claims.

What is claimed is:

1. A method of fabricating a semiconductor device on an SOI wafer having a substrate, a silicon dioxide film on top of said substrate and a silicon layer on top of said silicon dioxide film, comprising the steps of:

applying photoresist to an upper surface of said silicon layer and patterning said photoresist to leave said photoresist only on a first region in which said semiconductor device is to be fabricated;

removing said silicon layer located in a second region other than said first region by using reactive ion etching in which said photoresist works as a mask to form a silicon island composed of a portion of said silicon layer only in said first region;

forming a deposition silicon dioxide film in areas in said second region by using liquid phase deposition (LPD) while leaving said photoresist on said silicon island to thereby form an isolated region having said deposition silicon dioxide film in said second region without forming said deposition silicon dioxide film on said photoresist;

removing said photoresist; and forming a gate oxide film only on an exposed surface of said silicon island.

2. The method in accordance with claim 1, wherein said liquid phase deposition process is performed by using at least aqueous hydrosilicofluoric acid ($H_2SiF_6$) and boric acid ($H_3BO_3$).

3. A method of fabricating a semiconductor device on an SOI wafer having a substrate, a silicon dioxide film on top of said substrate and a silicon layer on top of said silicon dioxide film, comprising the steps of:

applying photoresist to an upper surface of said silicon layer and patterning said photoresist to leave said photoresist only on a first region in which said semiconductor device is to be fabricated;

removing said silicon layer located in a second region other than said first region by using reactive ion etching in which said photoresist works as a mask to form a silicon island composed of a portion of said silicon layer only in said first region;

forming a deposition silicon dioxide film in areas in said second region by using liquid phase deposition (LPD) while leaving said photoresist on said silicon island to thereby form an isolated region having said deposition silicon dioxide film in said second region without forming said deposition silicon dioxide film on said photoresist, said deposition silicon dioxide film being thicker than said silicon island;

removing said photoresist; and forming a gate oxide film only on an exposed surface of said silicon island.

4. The method in accordance with claim 1, wherein said substrate is selected from a single crystal silicon quartz substrate or glass substrate.

5. The method in accordance with claim 1, wherein said silicon layer is a single crystal silicon layer and said silicon island is a single crystal silicon island composed of said single crystal silicon layer.

6. The method in accordance with claim 1, wherein said silicon layer is a polycrystalline silicon layer and said silicon island is a polycrystalline silicon island composed of said polycrystalline silicon layer.

7. A method of fabricating a semiconductor device on an SOI wafer having a single crystal silicon substrate, a silicon dioxide film on top of said silicon substrate and a single crystal silicon layer on top of said silicon dioxide film, comprising the steps of:

applying photoresist to an upper surface of said single crystal silicon layer and patterning said photoresist to leave said photoresist only on a first region in which said semiconductor device is to be fabricated;

removing said single crystal silicon layer located in a second region other than said first region by using a reactive ion etching in which said photoresist works as a mask to form a single crystal silicon island comprised of a portion of said single crystal silicon layer only in said first region;

forming a deposition silicon dioxide film in selected areas in said second region by using liquid phase deposition (LPD) while leaving said photoresist on said silicon island to thereby form an isolation region having said deposition silicon dioxide film in said second region without forming said deposition silicon dioxide film on said photoresist;

removing said photoresist; and forming a gate oxide film only on an exposed surface of said single crystal silicon island.

8. The method in accordance with claim 7, wherein said deposition silicon dioxide film is thicker than said single crystal silicon island by about 20–30 nanometers.

* * * * *